United States Patent
Määttä

(10) Patent No.: US 6,308,377 B1
(45) Date of Patent: Oct. 30, 2001

(54) HINGED ELECTRONIC DEVICE

(75) Inventor: Esa Määttä, Tampere (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/444,286

(22) Filed: Nov. 19, 1999

(30) Foreign Application Priority Data

Nov. 26, 1998 (FI) .................................... 982564

(51) Int. Cl.⁷ .................................................. E05C 17/64
(52) U.S. Cl. .................................................. 16/341; 16/342
(58) Field of Search ........................... 16/341, 342, 348, 16/351, 352; 379/433, 434

(56) References Cited

U.S. PATENT DOCUMENTS

| | | |
|---|---|---|
| 4,620,344 | 11/1986 | Lewis, Jr. . |
| 4,701,978 * | 10/1987 | Selmer ................................ 16/380 |
| 5,075,929 | 12/1991 | Chung . |
| 5,274,882 * | 1/1994 | Persson ............................... 16/303 |
| 5,299,486 * | 4/1994 | Weingrill ........................ 84/380 R |
| 5,715,576 | 2/1998 | Liu . |
| 6,101,676 * | 8/2000 | Wahl et al. ........................ 16/342 |

FOREIGN PATENT DOCUMENTS

| | | |
|---|---|---|
| 0 801 489A2 | 10/1997 | (EP) . |
| 2 286 011 A | 8/1995 | (GB) . |

OTHER PUBLICATIONS

*EP 0 081 489 A2 corresponds to FI 961587 which is cited in the specification for the above identified patent application.

* cited by examiner

Primary Examiner—Anthony Knight
Assistant Examiner—Mark Williams
(74) Attorney, Agent, or Firm—Perman & Green, LLP

(57) ABSTRACT

A hinged, at least two-parted, electronic device. The hinge of the device comprises a tapered hinge pin (140) supported to a first turning part (110) and, matching with the pin, a tapered bowl (170) fixed to a second turning part (120+130), against which bowl the hinge pin rubs pushed by a spring (150). The hinge pin has as an extension of the tapered section a cylindrical section. When the hinge pin and/or the tapered bowl are worn the hinge pin (140) sinks deeper in the tapered bowl maintaining its friction properties essentially unchanged. The device preferably comprises also a second hinge (190+191,160), and the spring preferably continues forming the hinge axis of the second hinge (160). The hinge construction preferably comprises also means for passing a thin coaxial cable (CBL) from the base of the hinge to the vicinity of the hinge line to a section essentially parallel with the hinge line. In this way the coaxial cable connecting the turning parts can be made to twist on a section of its length and the strain directed at a length unit of the cable can be reduced to an acceptable level.

10 Claims, 9 Drawing Sheets

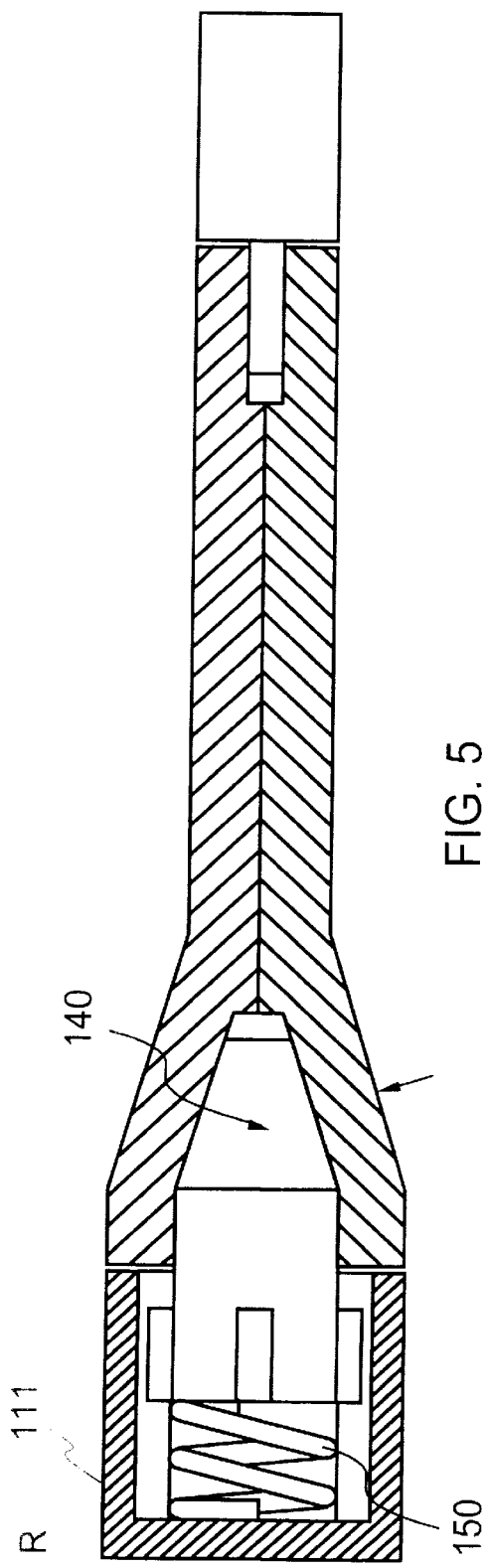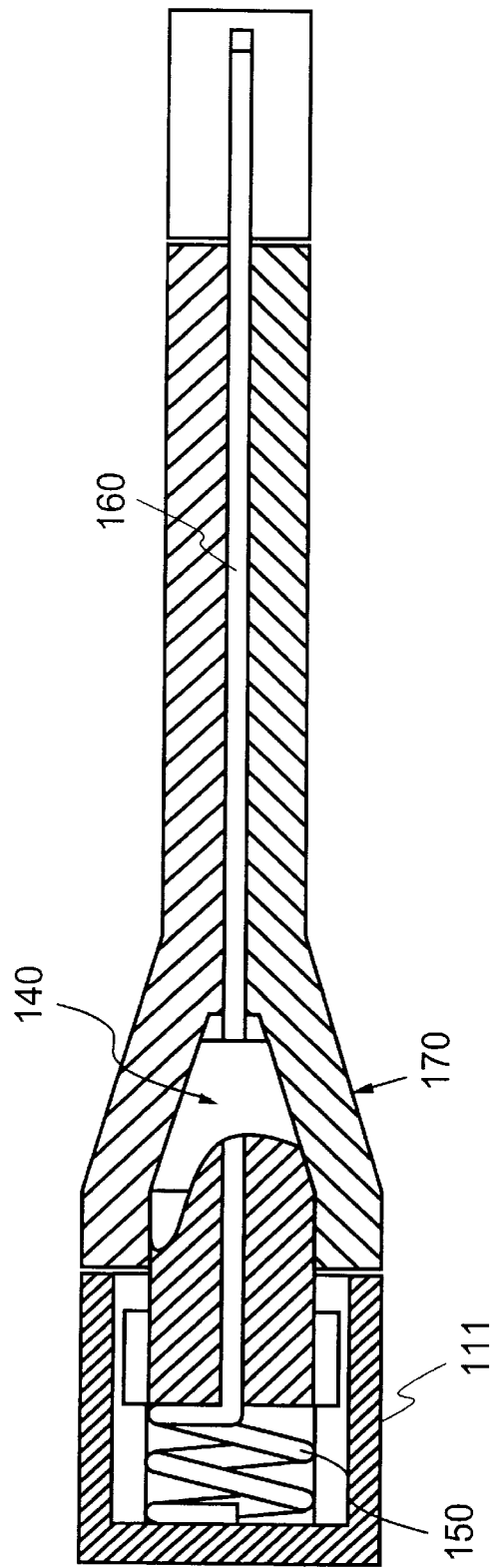

HINGED ELECTRONIC DEVICE

FIELD OF THE INVENTION

The present invention relates to a hinged electronic device, and particularly the miniaturized hinge construction of two parts adapted foldingly to each other.

BACKGROUND OF THE INVENTION

Miniaturized hinge constructions are used particularly in two-part mobile telephones and in various hand-held electronic devices. Such devices often comprise a base part and a top part turning in relation to it. In order to use these devices the two parts of the device are unfolded into a position, in which the parts form a certain angle between them. It is striven for that a device stays firmly in the open position when it is used and is not closed too easily. To close the device one has to direct at the turning part a force exceeding the friction and spring force resisting this movement. From the point of view of using the device, the force should not be too high nor too low. In certain cases it is also desirable to allow within certain limits an adjustable opening angle in order to arrange an ideal viewing angle in relation to the turning part for users of different height viewing the device from different levels. One of the desired features of such hinged electronic devices often is the smallest possible size. This desire generates a need to make also the hinges as small as possible. Yet the hinge constructions should endure wear well, in some cases up to 100000 times of opening and closing.

From Patent application publication FI 961587 such a hinge mechanism is known, in which a spring loaded moving part causes in a hinge that has been opened at a certain angle a force resisting its closing and preventing from opening the hinge any more. Even if the hinge is durable, it does not in all possible conditions prevent from closing the device by using the same force.

FIG. 1a shows a hinge for a portable computer according to U.S. Pat. No. 5,715,576, which allows, within certain limits, to open the display of the computer at a desired angle. Elongated and two-ended round rod 1 has at its first end been fixed to display frame 51. In the other end of the rod it has been fixed concentrically elongated and two-ended thin hinge axis 11. In the base of the hinge axis and the rod there is fixed on the axis and the rod round bushing 101, the head of which against the rod has been bevelled sharp on both its sides. The bevels end approximately in the middle of the length of the bushing. In this way it has been formed hinge axis 11 that is wedge-shaped in its base. In the frame of computer 50 it has been fixed outer bushing 2, narrowing toward the base of the hinge axis and internally tapered, in such a way that it surrounds the hinge axis co-axially. Friction piece 30 has been slipped around the hinge axis between the outer bushing and the hinge axis, which has the form of a cylinder tapering toward the base of the hinge axis. On the end of the friction piece facing the wedge shaped part of the base of the hinge axis there is a V-shaped slot that has been adapted to fit on the wedge shaped part of the base of the hinge axis. The tapered cylindrical surface of the friction piece has been adapted to follow the inner surface of the outer bushing and to generate friction on this junction to prevent it from rotating when the friction piece has been pushed toward the base of the hinge axis far enough for the bevel of the base of the hinge axis to fill the slot. In the assembly stage the outer bushing of the hinge has been placed around the hinge axis against rod 1. Friction piece 30 has been slipped around the hinge axis and been pushed into the outer bushing on the hinge axis, and spring 44 has been placed on the hinge axis. Then the spring has been compressed and fixed against the friction piece using plug 4 which has been locked to outer bushing 2.

When the display is turned to another position, the axis of the hinge fixed to the display starts to turn. The wedge in its base then turns slightly in the slot of the friction piece and causes a turning force in the slot, and because of the bevelled surface of the wedge, also a force attempting to draw the friction piece away from the base of the axis, and the friction piece moves a little axially against spring 44. At the same time, as the friction piece is drawn away from the narrower end of the outer bushing, the friction coefficient between the friction piece and the outer bushing is reduced and also the force turning the slot of the friction piece is reduced. Thus, when the display is turned, a balance is formed, wherein the force turning the slot settles on a certain level and the friction piece is slightly offset away from the base of the axis against compressing spring 44. When turning the display is ceased, the friction piece is again pressed against the base of the hinge axis as far as the spring force can push it against the tapered outer bushing and the wedge shaped part.

When the surfaces of the friction piece and outer bushing rubbing against each other become worn, the friction force preventing the hinge from turning becomes insufficient. The main part of the friction force is caused by the rubbing of surfaces between the friction piece and the outer bushing and only for a minor part by rubbing between the friction piece and hinge axis 11. When these surfaces wear, the depth of the slot limits the movement in the direction of the hinge axle of the friction piece when the bottom of the slot is pressed against the wedge shaped part. When the bottom of the slot is pressed against the wedge shaped part the slot receives the pressure caused by the spring and thence no pressure is generated between the friction surfaces, and due to it the friction between the friction surfaces disappears and the hinge no longer operates as designed. The hinge also takes up a reasonably big space.

As an additional feature it is desired of the hinge of a two-part mobile station a possibility to lead through the hinge an antenna cable from one folding part to the other, e.g. between the base part and the display part. This is necessary for example if the radio part is in the base part and it is desired to place an antenna in the other part in order to make it possible for a user to freely support the base part by its edges in his palms without needing to avoid the location of the antenna in the base part. An example of such a device is the Nokia 9000 Communicator mobile station that combines a PDA-device (Personal Digital Assistant) and a mobile station into a hinged two-part device.

SUMMARY OF THE INVENTION

Now such a hinged electronic device has been invented, in which the hinge pin of at least one of the hinges has been adapted to move axially and is simultaneously radially supported to the first of the parts to be hinged, and in which a first end of the moving hinge pin is tapered. The hinge pin is pressed in the axial direction by a spring element. The first end of the hinge pin is thus pushed into a tapered bowl and the tapered outer surface of the hinge pin touches the inner walls of the tapered bowl generating a friction force resisting the rotation of the hinge pin and tapered bowl in relation to each other. The tapered bowl is fixed to the second of the parts to be hinged. A change of the opening angle of the hinged device causes the hinge pin to turn in relation to the bowl and the friction between the hinge pin and the bowl strives to prevent the change of the opening angle. In this way the hinge strives to keep the opening angle of the device unchanged and to prevent an unintentional closing of the device or the changing of the opening angle e.g. due to gravity. The hinge also endures wear well, because the tapered friction surface of the hinge pin distributes the wear on a reasonably large area thus reducing the strain directed at the surface. At the same the axial play of the hinge pin and the spring load enable it to wear without the friction properties being significantly reduced. Alternatively, it is possible to arrange for the tapered bowl an axial play in order to maintain the load between the tapered part of the hinge pin and the inner surface of the tapered bowl and the friction force caused by it even when the friction surfaces are worn.

An electronic device comprising a first part and a second part and a hinge adapting said parts foldingly to each other, and which hinge comprises:

an elongated hinge pin having a first end and a second end, and which hinge pin has on its outer surface a tapered section, in which it is tapered toward its second end, a tapered bowl comprising an inward tapering inner surface, and which has been arranged to receive said tapered section of the hinge pin to touch its inner surface, a spring element for pressing said tapered section of the hinge pin and said tapering inner surface of the tapered bowl against each other in order to create a friction force resisting their turning in relation to each other and first means for arranging said tapered section and inner surface to be tumable in relation to each other and to be rubbing against each other due to the effect of said spring element when the device is opened and closed, in order to create a friction force resisting the opening and closing the device, said tapered section of the hinge pin and inner surface of the tapered bowl being the rubbing surfaces, characterized in that said electronic device comprises second means for enabling said rubbing surfaces to approach each other as a response to the wear of at least one of said rubbing surfaces, and said spring element has been arranged, as a response to the wear of at least one of said rubbing surfaces, to move said rubbing surfaces in relation to each other and toward each other in the direction of the hinge pin in order to maintain the load between the rubbing surfaces.

BRIEF DESCRIPTION OF THE DRAWINGS

The invention is explained in the following in more detail using examples and with reference to enclosed figures, of which FIG. 5 shows the construction of a hinge according to a third embodiment of the invention, FIG. 6 shows the construction of a hinge according to a fourth embodiment of the invention.

DETAILED DESCRIPTION

The essential feature of a hinge according to the invention, the creating of friction compensating the wear of the rubbing surfaces, is based on that a friction piece tapered on its outer surface and a bowl tapered on its inner surface are each supported one of the turning parts and are pressed together by a spring, allowing the friction piece and the bowl to approach each other when the rubbing surfaces wear. Thus, even when worn, the area, form and even the load of the surfaces creating the friction remain essentially unchanged and accordingly also the friction force remains at a certain level, as it will be explained in more detail later on.

Figure 1A:
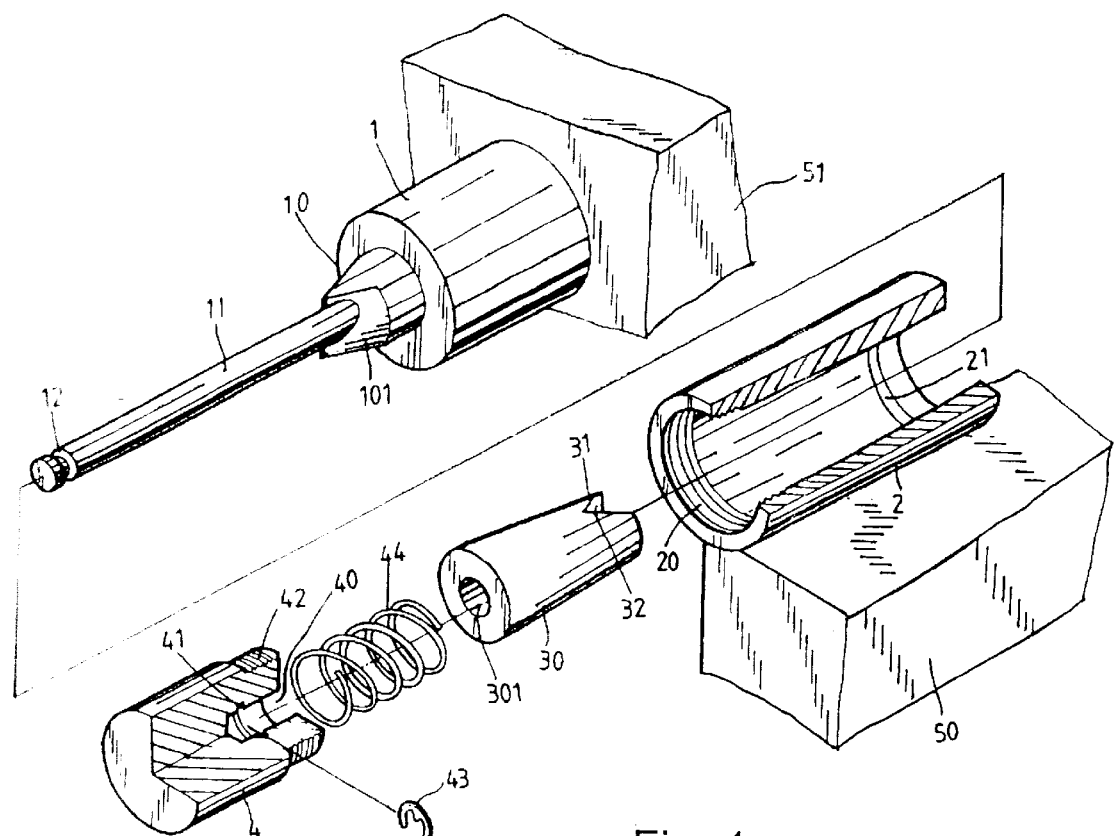
FIG. 1a shows a hinge according to prior art.
Figure 1B:
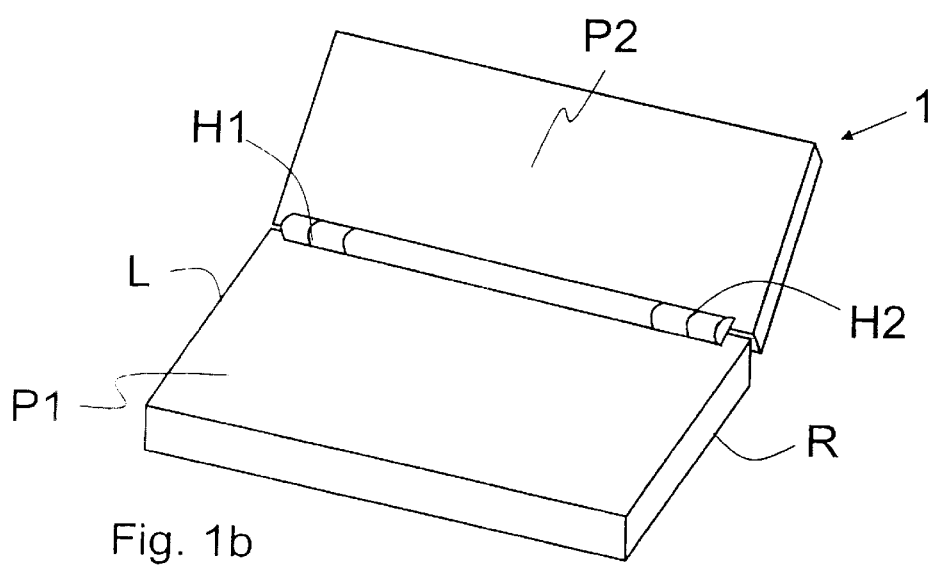
FIG. 1b shows a three-dimensional view of a two-part mobile station according to the invention seen obliquely from above.

FIG. 1b shows, viewed obliquely from above, two-part mobile station 1 according to the invention. It comprises first part P1 having a keyboard, and a second part P2 having a large display. With regard to the invention it has no importance in which way the parts open in relation to each other, nor what components they comprise nor what they are intended for. The invention is applicable also e.g. to hinges opening to the side, but here it is used as an example a mobile station according to the invention, alike the Nokia 9000 Communicator mobile station according to prior art. The mobile station comprises two hinges, first hinge H1 and second hinge H2. Out of these at least one comprises a hinge pin comprising a tapered outer surface and a tapered bowl matching this tapered surface in form and size, which have been tensioned against each other as it is explained later on. Thus at least one hinge causes a friction force that steplessly resists the change of the opening angle between first and second part H1 and H2 of the mobile station. That is to say that the friction force should remain at a particular level. The friction force should exceed a certain minimum force, i.e. it should be at least so high that in a normal operating situation an opened device should not close nor open due its own weight more than the user desires to open it. If for example the opening angle of the device is adjustable from zero to 135 degrees, the device shall remain open even at an angle of 120° without the angle increasing on its own due to the weight of the opened part. It has to be understood however, that a hinge according to the invention can be used for creating lower friction e.g. in order to improve the user friendliness when it is not intended to prevent the changes of the opening angle e.g. due to gravity. In order to make it easier to explain the invention reference L is used for the left end of the mobile station and reference R for the right end.

It is preferable to implement a small hinge according to the invention between the two parts (a first and a second part) to be connected using a coaxial cable in such a way that the coaxial cable is brought through the hinge to the hinge line and it is first laid loosely along the hinge line before it is led to the second turning part. In this case the cable can twist on a long stretch around its axis and the cable endures well the repeated opening and closing of the hinge.

Figure 2:
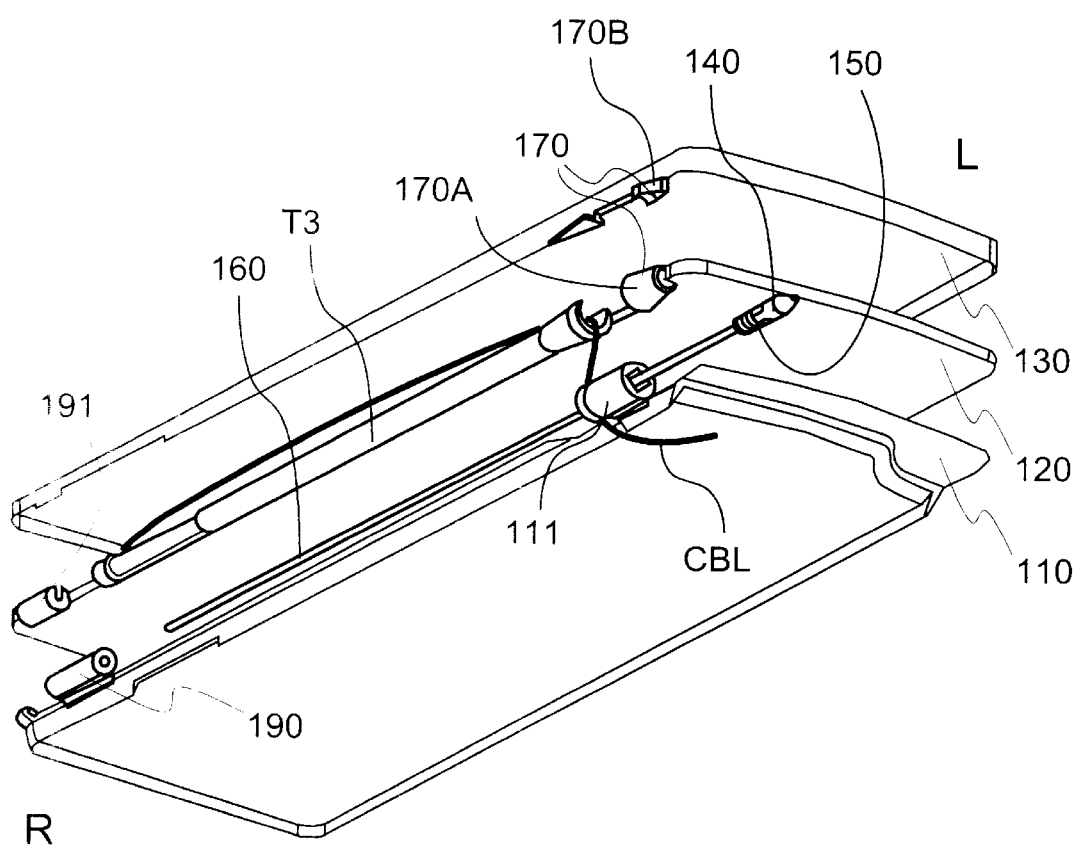
FIG. 2 shows the hinge construction of the two-part mobile station according to FIG. 1b with the mobile station folded together, dismantled and seen from below right.

FIG. 2 shows the hinge construction of the two-part mobile station according to FIG. 1b with the mobile station folded together, dismantled and seen from below and obliquely from behind. The first part shown in FIG. 1b comprises first inner wall 110. Second part P1 comprises second inner wall 120 and third wall 130 to be fixed to the former, the third wall being e.g. the top cover of the device or a partition wall. When folded together, inner walls 110, 120 settle against each other. Inner walls 110,120 and wall 130 also are elongated and they have left end L and right end R shown in FIG. 1b, of which the left end is on the right in this figure due to the viewing angle.

First inner wall 110 comprises on its first long side lock bushing 111 situated near left end L and on its same side first hinge bushing 190 situated near opposite end R, the bushing being on the same hinge line as the lock bushing. Lock bushing 111 is an elongated tubular object having two ends. The tapered bowl side end of the lock bushing has been grooved on its inner surface to comprise four grooves at a 90° angle to each other for approximately half of its length. The hinge construction also comprises hinge pin 140 and elongated hinge axle 160 made of steel wire. The hinge axle has a first and a second end. Hinge axle 160 has preferably been wound for a part of its length near its first end into coil spring 150, which fits loosely inside lock bushing 111. The lock bushing has preferably been provided on the side of right end R with a loose choke (not shown in the figure), through which the spring coil formed part of the hinge axle however cannot pass. In the same end of lock bushing 111 as the choke and on the outer surface of the end, there preferably is a groove (not shown in the figure) for a round coaxial cable. The groove begins at the edge of lock bushing 111 and ends just at its center line, in order to that a coaxial cable can be laid through it right next to the hinge axle, essentially parallel with the hinge axle. Thus it is possible to lay e.g. a coaxial cable used as antenna cable CBL from one hinged part to another (P1, P2 in FIG. 1b). Thus the opening and closing of the device twists the coaxial cable connecting the hinged parts on a relatively long stretch, e.g. 5 cm. This improves the endurance of the coaxial cable compared with the cable crossing the hinge axle perpendicularly and being exposed to a bending of the magnitude of the change of the opening angle e.g. with a bending radius of 1 mm.

Second inner wall 120 comprises passage T3 situated on the hinge line of a folded device. The passage is situated in an assembled device between lock bushing 111 and first hinge bushing 190 comprised in third wall 130 in order to provide a protected space for hinge axle 160 and antenna cable CBL. Antenna cable CBL is a thin coaxial cable, the thickness of which is approximately 1 mm. The passage has preferably been designed from the edge of second inner wall 120 and it preferably opens toward third wall 130. Passage T3 preferably reaches from lock bushing (111) of an assembled device to first hinge bushing 190, but it can be even shorter. Instead of passage T3 it is however possible to manufacture a tubular part to protect hinge axle 160 and antenna cable CBL, in which case the bowl part need not be open on the side, but in this case in order to lead the hinge axle and the antenna cable forward, they shall be threaded through the mouth of the bowl section of the tube. On second inner wall 120 there preferably is also near left end L, on the hinge line, tapered first bowl part 170A. The bowl part preferably is open on one side, preferably on the side toward third wall 130, in order to enable hinge pin 140 to be easily installed in the assembly stage. Second inner wall 120 preferably comprises also second hinge bushing 191 open on the side toward third wall 130, fixed on the hinge line. Alternatively, second hinge bushing 191 can also be fully tubular. Second inner wall 120 further comprises second hinge bushing 191 near its second end, on the hinge line. The second hinge bushing is in an assembled device next to first hinge bushing 190, i.e. the first hinge bushing settles between the second hinge bushing and passage T3, and the hinge axle is assembled between these hinge bushings and inside the passage, forming a hinge near right end R.

Due to the open side of passage T3 it is easy to lay antenna cable CBL and hinge axle 160 in the passage. The passage also provides protection for the antenna cable hiding it and preventing it from getting caught, and passage T3 provides a loose space, in which the antenna cable can twist on a stretch that is long compared with its diameter. The passage also acts as a part of the hinge construction as shown in FIG. 2. The passage acts as a support surface against hinge axle 160. An advantage of the passage compared with a tube is the possibility to use as the antenna cable a coaxial cable provided with pre-installed termination connectors, in which case the assembling and service of the device become easier, as the end of the cable need not be terminated to a component of an already partly assembled device.

Third wall 130 comprises second bowl part 170B covering the open position of first bowl part 170A in an assembled device. Together the bowl parts form a conical seat or tapered bowl 170, which is on the hinge line and concentrically with lock bushing 111 comprised in first inner wall 111, and the tapered bowl opens toward the lock bushing.

FIG. 3a shows the construction of a hinge according to a first embodiment of the invention in a cross-view seen from the side and from the front, partly dismantled, and FIG. 3b shows it assembled. The hinge comprises a tapered bowl consisting of two parts 170A and 170B, hinge pin 140, lock bushing 111, mouth 310 of passage T3 settling next to the lock bushing and spring 150. The hinge pin is an elongated, cylindrical object, which has in its first end been notched to comprise four protrusions 143. In its second end the friction element has been reduced to frustum 141. Lock bushing 111 preferably comprises on its entire length grooves 112 matching notches 143 in the hinge pin to be placed inside it, in which grooves the protrusions of the hinge pin can glide in the direction of the hinge line, but in which they cannot, except for their small tolerance, turn around the hinge line. The frustum fits tightly to the tapered inner surfaces of the tapered bowl 170S1A and 170S1B in such a way that the tapered surface of the hinge pin touches at least with a major part of its area, preferably with its whole surface, the tapered inner surface of tapered bowl 170S1A, 170S1B. The tapered bowl can preferably comprise also a cylindrical section near its mouth in order to increase the solidity of the hinge. In that case the cylindrical middle section of the hinge pin 142 can support itself radially to inner surface of the cylindrical section 170S2A, 170S2B preventing the moving of the hinged parts in relation to each other perpendicularly to the hinge line.

Tapered inner surfaces of an assembled tapered bowl 170S1A,170S1B and taper of the hinge pin 141 are concentric. The tapered end of the hinge pin is pressed against the tapered bowl when spring 150 is pressed between the tapered bowl side flange of the lock bushing and first end of the hinge pin 180. In said end flange it has been formed for hinge axle 160 a hole, through which the hinge axle, except for the spring, can be threaded prior to assembling the device. Inside tapered bowl 170A & 170B its tapered section can also change into a cylinder and provide a space for the section of the hinge pin continuing as a straight rod after the tapered section (not shown in the figure). In this way the strength of the hinge can be further increased.

FIGS. 3a and 3b also show, according to another embodiment of the invention, curve C1 in the hinge axle and matching recess S1 in passage T3 facilitating snap-locking. The hinge rod deviates in curve C1 from its hinge line and rubs the inner wall of passage T3, in which it has been made e.g. in one point a recess or groove S1 parallel to the hinge axle. When the hinged parts turn the hinge rod remains unturned in relation to lock bushing 112, being fixed to the hinge pin and/or due to the friction caused by the pressing surfaces of the hinge pin and the end flange of the lock bushing. When passage T3 turns in relation to the hinge axle and the hinge axle is in recess S1, curve C1 yields with a snap to the turning force allowing the passage to continue turning. Correspondingly, when the curve turns back to recess S1 it snaps into the recess resisting for its share any changes of the opening angle. It is evident that the thus formed snap-feature is applicable to implement a friction step or steps to the otherwise stepless hinge construction according to the invention implemented using tapered elements and the feature is well suited for some objects, e.g. for increasing the opening threshold of a folding mobile station, but the feature is not necessarily needed. It is also evident that in this way it is possible to form several friction steps by increasing the number of the recesses made in the inner surface of passage T3. In another embodiment of the invention in one of the tapered surfaces, e.g. in the hinge pin or in its end pointing to the tapered bowl it has been formed chisel-formed protrusions and in the other tapered surface, e.g. in the tapered bowl it has been formed grooves, in which these protrusions sink at certain opening angles of the hinge. Preferably however both the tapered surface and the inner surface of the tapered bowl are smooth, in which case the friction properties of the hinge do not change much due to wear.

The material of hinge pin 140 is preferably the same as in the walls of the device itself, i.e. for example: ABS (Acrylnitrile-Butadien-Styren), ABS/PC (ABS/Polycarbonate), ABS/PA (ABS/Polyamid), PS (Polystyren) or SB (Styren-Butadien). The material of hinge pin cone 141 may vary depending on the friction required. High friction is achieved by using soft elastomer, such as PU (hard polyurethane isomers), rubber or silicon, and low friction by using hard polymers, such as PA, PC or metal. Spring 150 has been manufactured of e.g. steel wire or stainless steel (wire). When hinge pin 140 acts as a hinge axle or as a part of it, i.e. radially supports the hinged parts to each other, the hinge pin can be strengthened by manufacturing it of strong plastic, for example of glassfiber reinforced PA, or by placing a steel wire inside the hinge pin (e.g. the extension of the hinge pin). Tapered bowl 170A & 170B can be protected from wear by coating it with a layer of metal.

When hinge pin 140 and/or tapered bowl 170 wear the material removed from their surfaces exits in the form of fine dust or powder between lock bushing 111 and the tapered bowl, having first drifted between the tapered section and the inner surface of the tapered bowl toward the second end of the hinge pin. If desired, it is possible to arrange in the tapered bowl e.g. grooves parallel to the length of the hinge pin for removing the formed dust or powder from between the friction surfaces.

Figure 3:
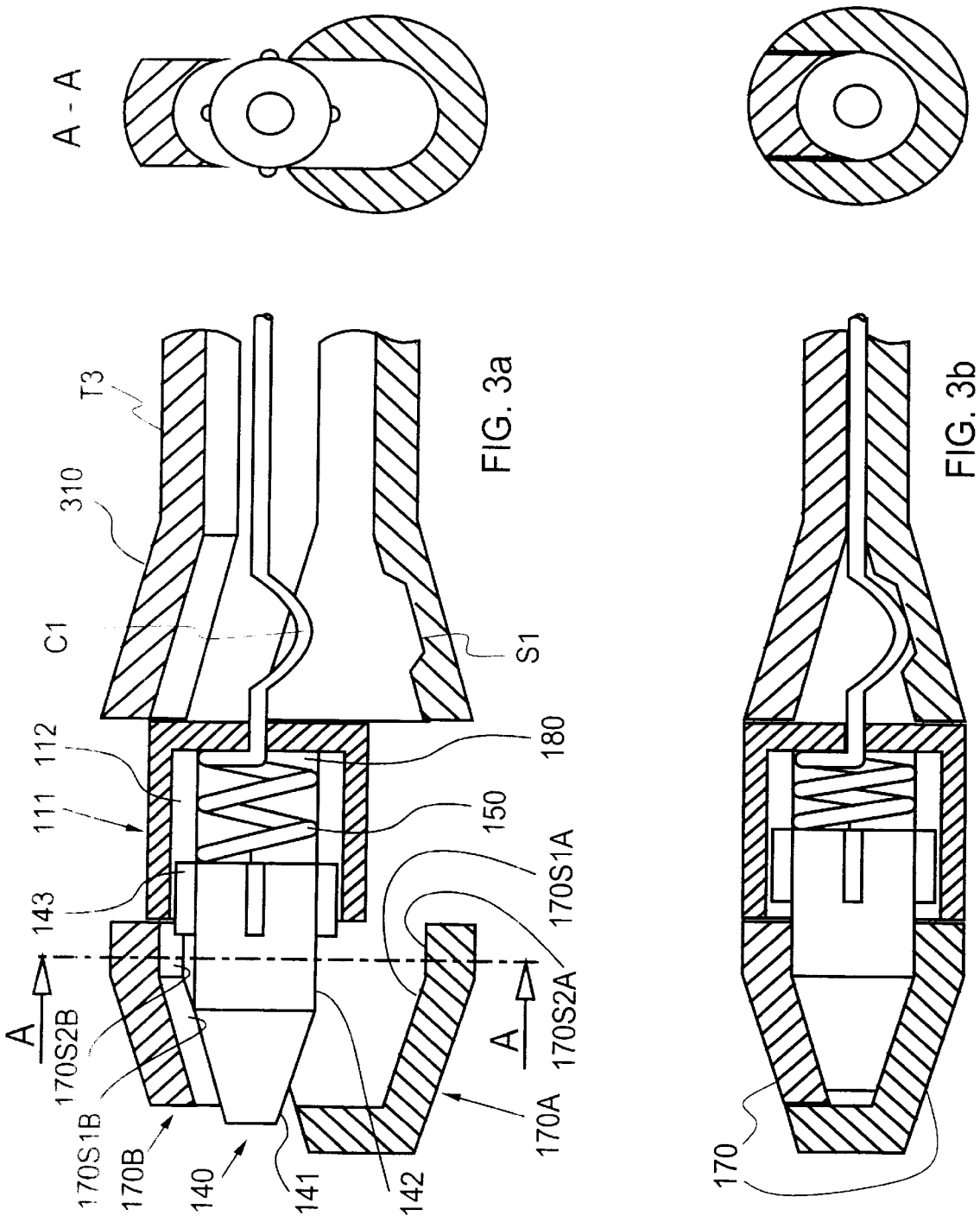
FIG. 3a shows the opened construction of a hinge according to a first embodiment of the invention in a cross section seen from the side and from the front.
FIG. 3b shows of an assembled hinge the same cross-views as in FIG. 3a, FIG. 4 shows the construction of a hinge according to a second embodiment of the invention utilizing an elastomeric spring.
Figure 4:
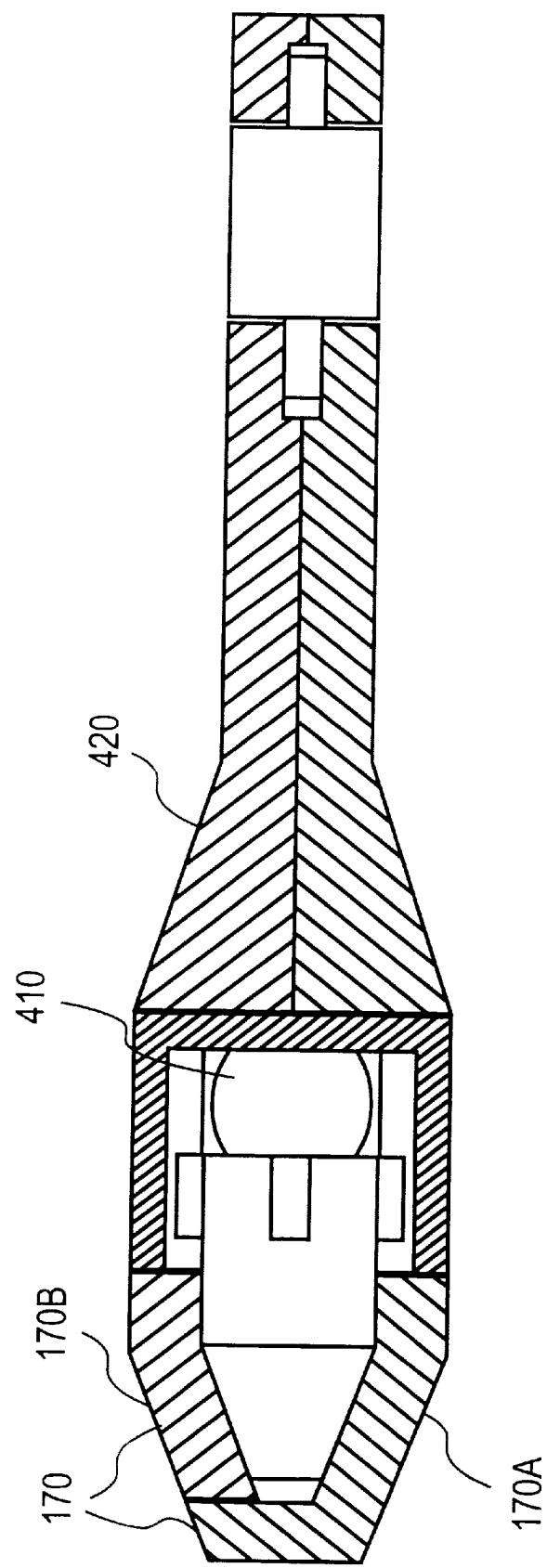

FIG. 4 shows a hinge construction according to a second embodiment of the invention utilizing an elastomeric spring. The construction corresponds with the structure according to FIG. 3, except for that in this construction as the spring element pushing the hinge pin to the tapered bowl it is used elastomeric element 410 which is pressed between the hinge pin and the bottom of the tapered bowl, thus creating a force loading the hinge pin against the tapered bowl. When elastomeric spring element 410 is used, it is possible to omit passage T3, unless it is desired to lay the antenna cable through it. In that case the lock bushing can be bordered to solid intermediate piece 420, as shown in the figure. Alternatively, when an elastomeric spring element is used, it is possible to manufacture the passage according to FIGS. 2 and 3 for laying the antenna cable to the hinge line without the hinge axle getting in its way, because in this alternative embodiment a hinge axle is not necessarily installed.

FIG. 5 shows the construction of a hinge according to a third embodiment of the invention, in which construction lock bushing 111 and tapered bowl 170 are in a reversed order compared with FIGS. 2 to 4. The lock bushing opens toward first and second hinge bushings 190,191 and the cone in hinge pin 140 is in tapered bowl 170 opening toward right end R, which bowl now is a part of passage T4, otherwise alike passage T3.

FIG. 6 shows the construction of a hinge according to a fourth embodiment of the invention, which construction is alike the construction shown in FIG. 5, except that in it spring 150 pushing the cone of hinge pin 140 to tapered bowl 170 continues as hinge axle 160 through the hinge pin to the passage or to tube T5. The hinge axle preferably continues until the first hinge bushing according to FIG. 2, but not necessarily through it. In a construction according to FIG. 6 a space must be left inside the hinge bushing in order to enable the hinge axle to push deeper in order to that the hinge axle should not hit the solid end of the hinge bushing and thus prevent spring 150 from loading worn hinge pin 140 against tapered bowl 170.

Figure 7:
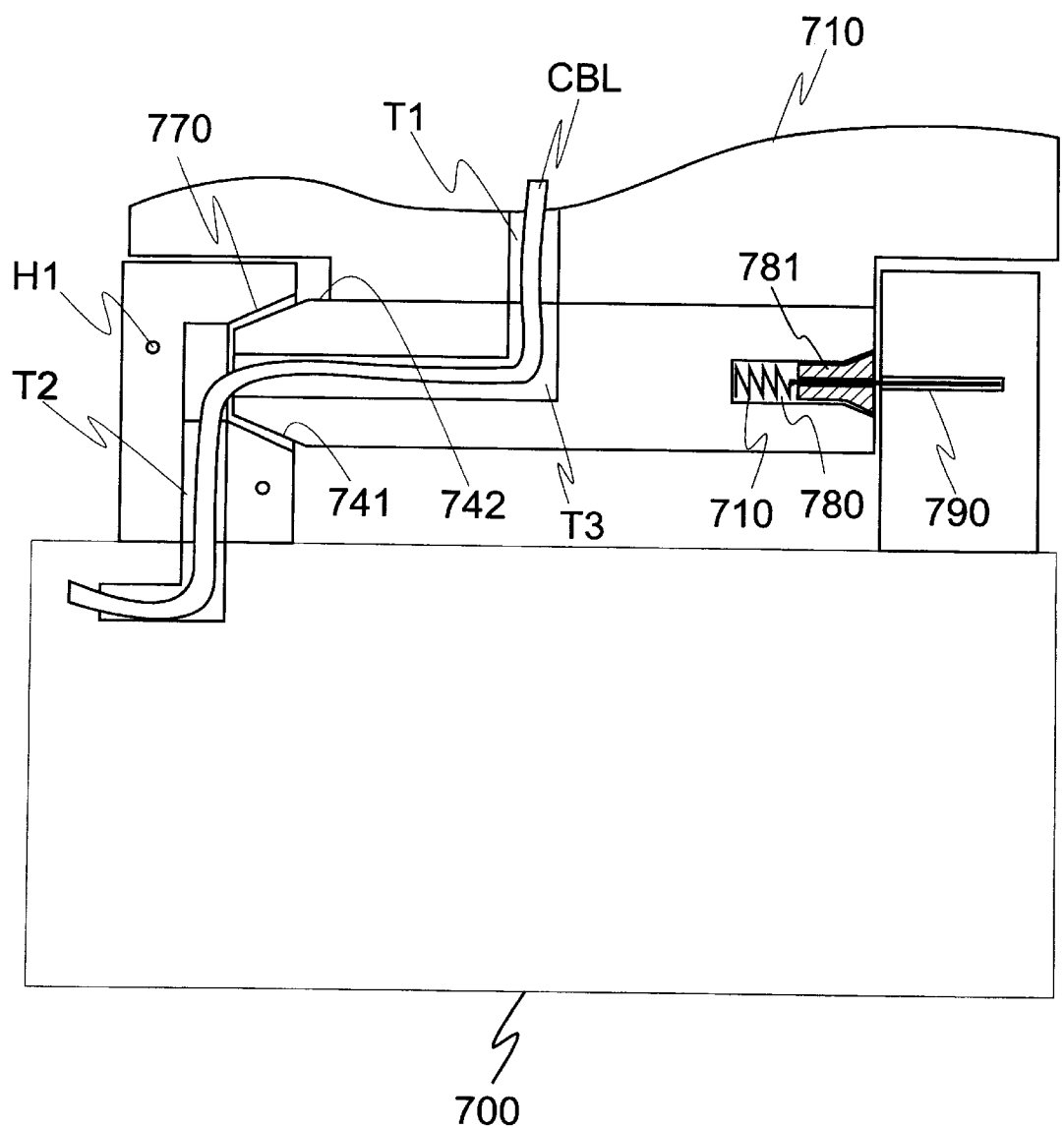
FIG. 7 shows a hinge construction according to a fifth embodiment of the invention.

FIG. 7 shows a hinge construction according to a fifth embodiment of the invention. A two-part device has two parts, base part 700 and display part 710. The hinge construction comprises two hinges, the first of which comprises tapered bowl 770 belonging to the base part, protruding slightly from the side of the base part but opening in the direction of the side of the base part and a tubular part belonging to the display part and acting as a hinge pin, the part comprising cone 741 and cylindrical section 742. The second hinge comprises third hinge bushing 790 belonging to the base part, second hinge axle 710, one end of which has been wound into a spring, first bore 780, and adapter bushing 781 installed in the bore. In the construction according to FIG. 7 it has been arranged for antenna cable CBL tunnel T1 from the display part up to the hinge line, and tunnel T3 following the hinge line through taper 741 to the bottom of tapered bowl 770. From the bottom of tapered bowl 770 antenna cable CBL turns away from the hinge line and goes along tunnel T2 to the base part. Hinge axle 710 of the second hinge has been adapted to the bore, and the spring section at the end of the hinge axle presses, from the bottom of the bore, the display part toward the first hinge while the other end of the hinge axle backs to the bottom of third hinge bushing 790. In order to make the assembly easier tapered bowl 770 is manufactured to be assembled from two parts (only the first half, fixed to the base part, is shown), and the top half of the tapered bowl can be fixed using e.g. screws or claw couplings to holes H1 on top of cone 741 when the parts of the second hinge first have been put in place. The advantage of this kind of hinge construction is that assembling is very simple because the hinge construction comprises only three separate parts: a hinge axle, an adapter bushing and the second half of the tapered bowl.

FIGS. 8a–f show different hinge pins according to the invention. Hinge pin 8a has a cylindrical base part, from the level of which protrude ribs 144 preventing rotation inside a lock bushing, and hinge pin 8b has on two sides bevelling 145 to prevent rotation inside the lock bushing. Hard tapered section 141B of hinge pin 8c is coated with soft elastomer, inside hinge pin 8d it has been molded or placed soft elastomer 410 as a spring element to replace a metal spring, inside hinge pin 8e is pre-installed metal spring 151, and hinge pin 8f is a hinge pin made of soft elastomer, which pin is supported by the straight extension of metal spring 152. Metal spring 152 also forms a hinge axle.

Figure 9:
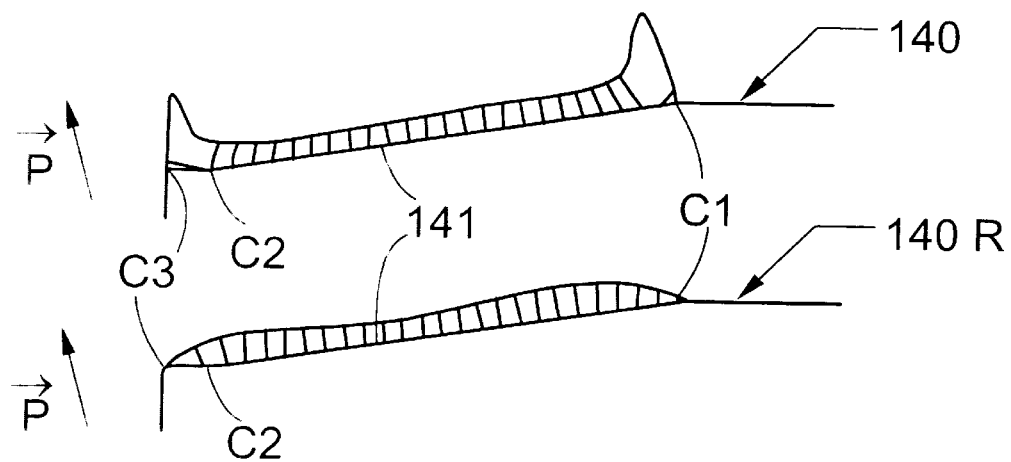
FIG. 9 shows a graph of the surface pressure directed at the surface of a hinge pin according to the invention in the different parts of the surface during operating and a corresponding graph of the surface pressure effecting in the different parts of the surface of a hinge pin with rounded edges.

FIG. 9 shows the descriptor of the surface pressure, parallel to vector $\vec{P}$ and directed at tapered surface 141 of hinge pin 140 according to the invention in different parts of the surface during operating, and the descriptor of the corresponding surface pressure effecting on the different parts of surface 140R of the hinge pin, which hinge pin is rounded in the edges and continues after tapered surface 141 as a cylinder for a short distance. The figure illustrates how it is possible, by using rounded design, to reduce point loads directed at the hinge pin in corners C1, C2 and C3 and in this way to slow down the wear of the hinge pin and the forming of dust.

Figure 8:
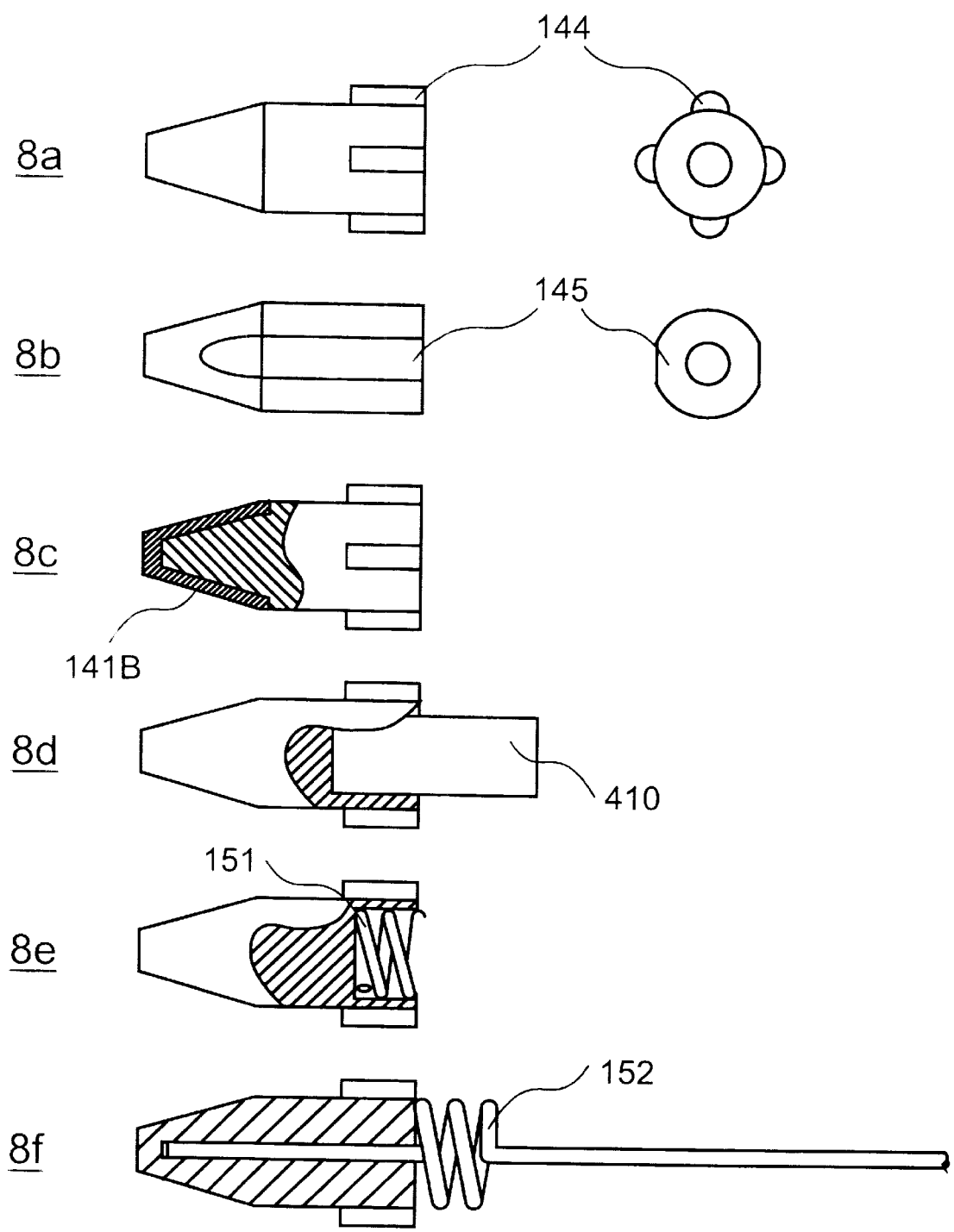
FIGS. 8a–f show different hinge pins according to the invention.
Figure 10:
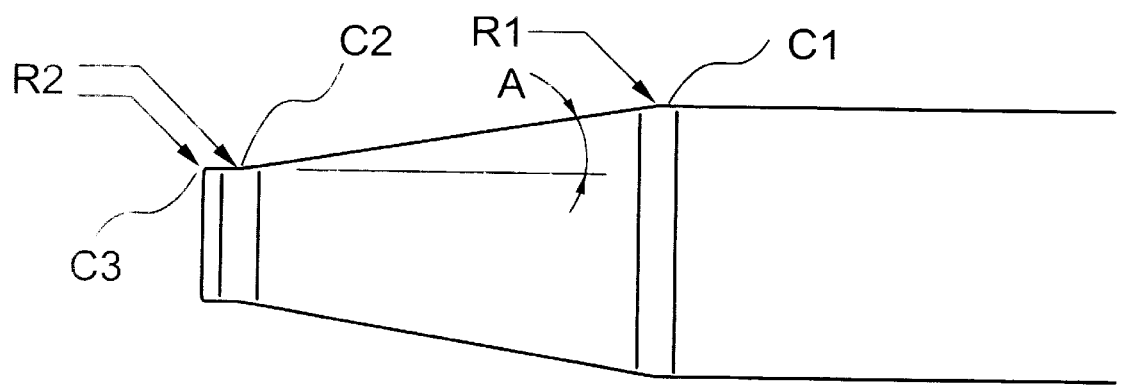
FIG. 10 shows the tapered end with rounded edges of a hinge pin according to the invention.

FIG. 10 shows the tapered end of a hinge pin according to FIG. 8, rounded in the corners, corner C1 of which is rounded to radius of curvature R1 and corners C2 and C3 to radius of curvature R2. The figure also shows angle of taper A describing the steepness of the taper. The bigger the angle of taper, the shorter the taper naturally comes, the higher the pressure the taper is exposed to, and the faster the surface of the taper wears. Inversely, a gentle angle of taper results in a longer taper and better resistance to wear. Said corners C1, C2 and C3 can each have a radius of curvature of their own, but these can also be chosen individually, different from each other.

Figure 11:
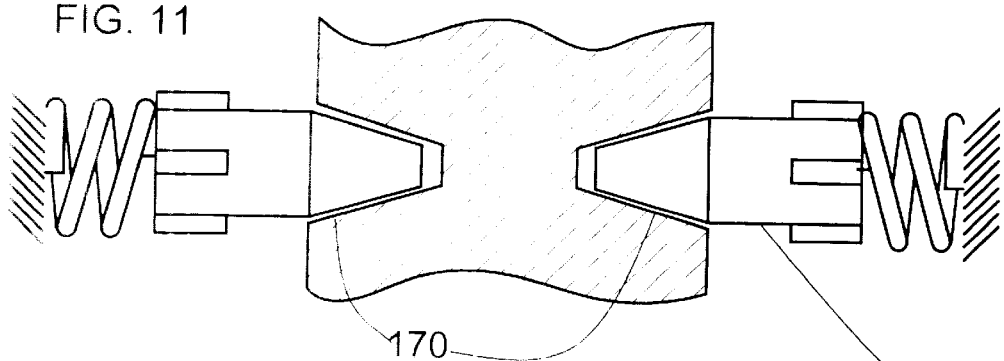
FIG. 11 shows a double-tapered construction according to a sixth embodiment of the invention.

FIG. 11 shows a dual-taper construction according to a sixth embodiment of the invention, in which construction a hinged device comprises in one of its turning parts two tapered bowls 170 opening to opposite directions and hinge pins 140 tensioned against the bowls from outside using compressed springs. The hinge operates as explained earlier, except that in this case the friction surfaces have been doubled in a way shown in the figure. The figure does not show the lock bushings surrounding the hinge pins, which lock bushings can be e.g. alike the ones described above.

Figure 12:
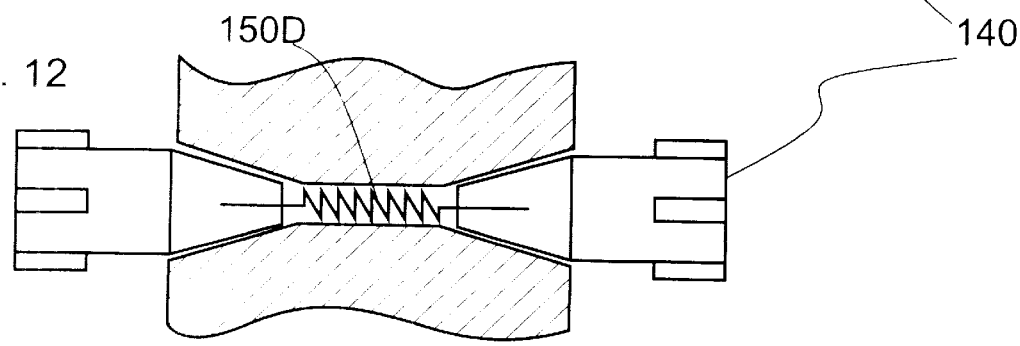
FIG. 12 shows a double-tapered construction according to a seventh embodiment of the invention.

FIG. 12 shows a dual-taper construction according to a seventh embodiment of the invention. The dual-taper construction according to FIG. 12 is alike the one shown in FIG. 11, except that in this construction the bottoms of the tapered bowls are connected by a tunnel, in which there is drawspring 150D pulling the hinge pins toward each other.

Figure 13:
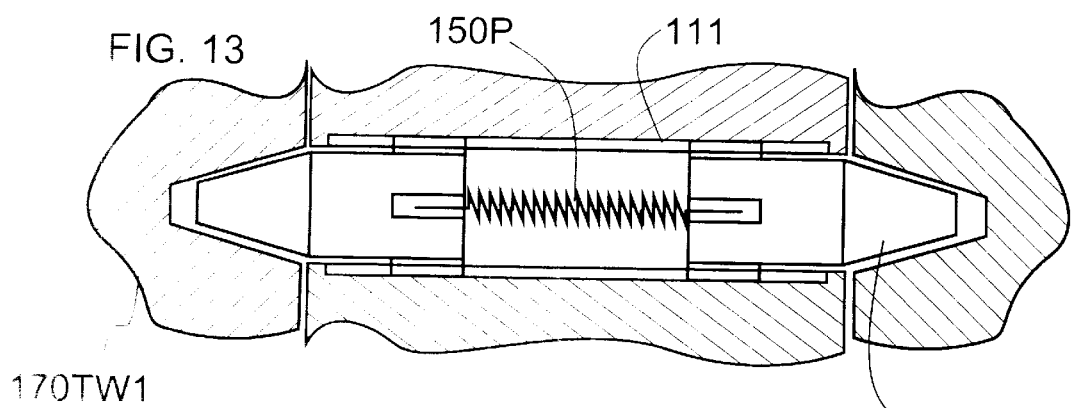
FIG. 13 shows a double-tapered construction according to an eighth embodiment of the invention.

FIG. 13 shows a dual-taper construction according to an eighth embodiment of the invention. In this construction the tapered bowls open toward each other and between them there are two hinge pins 140 in lock bushing 111 common to both hinge pins, the pins being pushed away from each other against tapered bowls 170TW1 by compressed spring 150P.

Figure 14:
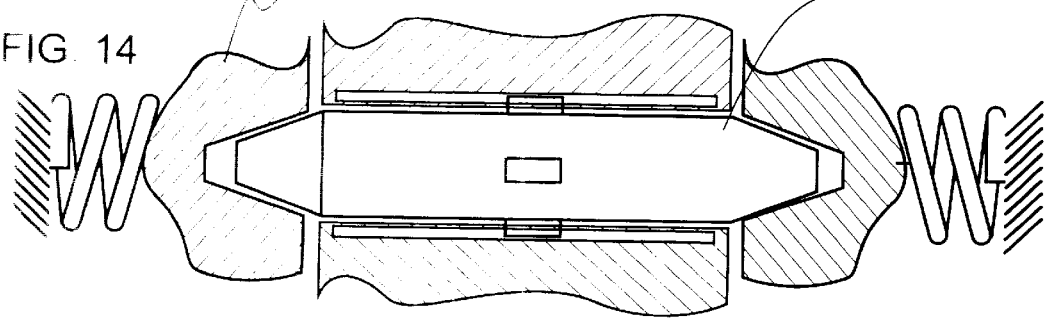
FIG. 14 shows a double-tapered construction according to a ninth embodiment of the invention.

FIG. 14 shows a dual-taper construction according to a ninth embodiment of the invention. In this construction both ends of the hinge pin have been tapered and axially moving tapered bowls 170TW2 are pressed against the ends of the hinge pin by springs.

The advantage of a hinged electronic device according to the invention is the achieved small size and the high resistance to wear of the friction surfaces in relation to the size. The construction also is very simple compared with prior art and thus also well suited for both automatic and manual assembling. In a construction according to FIG. 2, to implement the hinges of a two-part mobile station it is only required, in addition to the even otherwise necessary separate walls, only two separate components, axle rod 160, which also acts as spring 150, and hinge pin 150. The hinge can be manufactured to be thin, because in a hinge according to the invention parts moving in relation to each other are needed in only two layers (hinge pin and tapered bowl), differently from e.g. a device according to FIG. 1a, in which device there is inside a tapered bushing a tapered friction piece and further inside it axle 12. The resistance to wear of a hinge according to the invention is finally determined by the thickness of the wear surfaces and by the play to be left in the tapered bowl in front of the hinge pin, because the spring pushes the hinge pin deeper and deeper and maintains a pressure between the friction surfaces within the limits set by the play of the hinge pin.

The stiffness of a hinge according to the invention can be widely adjusted through choosing the materials of the friction surfaces, the tension of the spring, the angle of taper, the length of the taper and the diameter of the taper. A hinge according to the invention is particularly preferable in the case of e.g. communicator-type two-part mobile stations and PDA devices, but it is also applicable to e.g. a hinge between the display part and base part in portable computers.

The above is a description of the realization of the invention and its embodiments utilizing examples. It is self evident to a person skilled in the art that the invention is not limited to the details of the embodiments described above and that the invention can be realized also in other forms without deviating from the characteristics of the invention. The presented embodiments should be regarded as illustrating, but not limiting. Thus the possibilities to realize and use the invention are limited only by the enclosed claims. Thus different embodiments of the invention, also equivalent embodiments, are included in the scope of the invention.

What is claimed is:

1. A hinged electronic device comprising a first part and a second part and a hinge adapting said parts foldingly to each other between a first and a second configuration, and which hinge comprises:

an elongated hinge pin having a first end and a second end, and which hinge pin has on its outer surface a tapered section, in which it is tapered toward its second end, a tapered bowl comprising an inward tapering inner surface, and which has been arranged to receive said tapered section of hinge pin to touch its inner surface, a spring element for pressing said tapered section of hinge pin against the tapered inner surface of said tapered bowl in order to create a friction force resisting turning of the first part in relation to the second part and first means for arranging said tapered section to be turnable in relation to said inner surface and to be rubbing against said inner surface due to the effect of said spring element when the first and second parts are turned about the hinge between the first and second configuration in order to create a friction force remaining on a particular level and resisting the opening and closing of the device between the first and second configuration, said tapered section of the hinge pin and inner surface of the tapered bowl being the rubbing surfaces, wherein said electronic device comprises second means for enabling said rubbing surfaces to approach each other as a response to the wear of at least one of said rubbing surfaces, and said spring element has been arranged, as a response to the wear of at least one of said rubbing surfaces, to move said rubbing surfaces in relation to each other and toward each other in the direction of the hinge pin in order to maintain the load between the rubbing surfaces.

2. An electronic device according to claim 1, wherein the angle of taper of said tapered section and tapered bowl correspond to each other, in which case the area of the tapered section rubbing against the inward tapering part of the tapered bowl remains substantially unchanged when the surfaces rubbing against each other wear.

3. A device according to claim 1, wherein said second means comprise on the side of the first end of the hinge pin a first form differing from circular in a cross-section perpendicular to the hinge axis and a hinge piece surrounding the hinge pin at least in the position of said first form and extending from it for a certain length toward the second end of the hinge pin, the inner surface of said hinge piece having a second form matching with the first form, in which hinge piece one of said forms is a protrusion with respect to the surrounding surface and the other of said forms is respectively a recess with respect to the surrounding surface leaving for the protruding form a space in which the protrusion sinks, and in which the protrusion is shorter than the recess in the direction of the hinge pin, and the recess extends in an assembled device toward the tapered bowl farther than said protrusion, in which case said hinge pin and the protrusion in it have in the recess room to move in the longitudinal direction of the hinge pin toward the tapered bowl.

4. A device according to claim 1, wherein the edge between the tapered section of said hinge pin and the cylindrical section has been rounded off using a first radius of curvature and the edge on the second end of said cylindrical section has been rounded off using a second radius of curvature in order to even out the surface pressure profile effecting on the surface of the tapered section.

5. A device according to claim 1, wherein out of the inner surface of the tapered bowl and of the outer surface of the cylindrical section at least one surface comprises one of the following materials: metal, plastic, rubber and soft elastomer.

6. A device according to claim 1, wherein the device also comprises a second hinge, and both hinges are on the same hinge line, said spring element is a spring wound of steel wire, the spring element having two ends, a first end of the spring element and a second end of the spring element, and said second end of the spring element continues until said second hinge and forms the second hinge pin of this second hinge.

7. A device according to claim 1, wherein said hinge pin comprises a first conduit for passing a cable through it from the position of said hinge axis substantially to the hinge line in its one end, said tapered bowl comprises a second conduit substantially on the hinge line, inside which conduit the cable passing through the hinge pin can twist, the device comprises a third conduit following the hinge line and ending in connection with the tapered bowl for passing inside it, loosely supported, a cable for a certain stretch, which stretch is many times longer than the diameter of the cable, enabling the cable to twist inside the conduit and for passing the cable to a part that is fixed to it with hinges, which part turns in relation to said tapered bowl.

8. A device according to claim 1, wherein said hinge pin is a fixed part of said first part and said tapered bowl is a fixed part of said second part, said spring element has been arranged to cause between the first and second part a force bringing these parts closer to each other in the direction of the hinge line in order to create said load between the surfaces rubbing against each other and to create said friction force.

9. A device according to claim 1, wherein said spring element is integrated in said hinge pin.

10. An electronic device according to claim 1, wherein the device is a mobile station.

* * * * *